(12) United States Patent
Cho et al.

(10) Patent No.: US 9,786,844 B2
(45) Date of Patent: Oct. 10, 2017

(54) MASK ASSEMBLY, APPARATUS, AND METHOD OF MANUFACTURING DISPLAY DEVICE USING THE MASK ASSEMBLY

(71) Applicant: Samsung Display Co., Ltd., Yongin-si (KR)

(72) Inventors: Youngsuk Cho, Yongin-si (KR); Taemin Kang, Yongin-si (KR); Jaesik Kim, Yongin-si (KR); Jeongkuk Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/183,375

(22) Filed: Jun. 15, 2016

(65) Prior Publication Data
US 2017/0179389 A1  Jun. 22, 2017

(30) Foreign Application Priority Data
Dec. 18, 2015 (KR) .................. 10-2015-0181848

(51) Int. Cl.
*H01L 51/00* (2006.01)
*H01L 51/56* (2006.01)
(Continued)

(52) U.S. Cl.
CPC ........ *H01L 51/0011* (2013.01); *C23C 16/042* (2013.01); *H01L 27/3216* (2013.01);
(Continued)

(58) Field of Classification Search
CPC . H01L 51/0011; H01L 51/56; H01L 27/3246; H01L 51/001; H01L 27/3216;
(Continued)

(56) References Cited

U.S. PATENT DOCUMENTS

2007/0231939 A1* 10/2007 Kuriya .................. C23C 14/042
438/22
2013/0009177 A1* 1/2013 Chang ..................... C23C 14/12
257/88

(Continued)

FOREIGN PATENT DOCUMENTS

KR  10-2013-0084366  7/2013
KR  10-2014-0014053  2/2014
(Continued)

*Primary Examiner* — Selim Ahmed
(74) *Attorney, Agent, or Firm* — H.C. Park & Associates, PLC

(57) ABSTRACT

Provided is a mask assembly, an apparatus, and a method of manufacturing a display apparatus using such mask assembly and apparatus. The mask assembly deposits a deposition material on a first pixel among a plurality of pixels disposed on a device substrate and including the first pixel and a second pixel includes a mask substrate, a molding layer stacked on the mask substrate and including a hole corresponding to a position of the second pixel, a blocking plate detachably mounted in the hole and configured to block the second pixel from the deposition material by covering the second pixel when the blocking plate is detached from the hole.

7 Claims, 17 Drawing Sheets

(51) Int. Cl.
  *H01L 27/32* (2006.01)
  *C23C 16/04* (2006.01)
  *H01L 51/50* (2006.01)

(52) U.S. Cl.
  CPC ........ *H01L 27/3246* (2013.01); *H01L 51/001* (2013.01); *H01L 51/56* (2013.01); *H01L 51/5012* (2013.01); *H01L 2227/323* (2013.01)

(58) Field of Classification Search
  CPC ........... H01L 2227/323; H01L 51/5012; C23C 16/042
  See application file for complete search history.

(56) References Cited

U.S. PATENT DOCUMENTS

2014/0312316 A1* 10/2014 Choi .................... C23C 14/042 257/40
2014/0357003 A1 12/2014 Yu
2014/0370196 A1 12/2014 Kim
2015/0037928 A1 2/2015 Hirobe et al.
2015/0068455 A1 3/2015 Lee et al.
2015/0102329 A1 4/2015 Lee
2016/0248049 A1* 8/2016 Hong .................... C23C 14/042
2016/0301036 A1* 10/2016 Han ........................ H01L 51/56

FOREIGN PATENT DOCUMENTS

| | | |
|---|---|---|
| KR | 10-2014-0090267 | 7/2014 |
| KR | 10-2014-0145886 | 12/2014 |
| KR | 10-2015-0011399 | 1/2015 |
| KR | 10-2015-0029414 | 3/2015 |
| KR | 10-2015-0042601 | 4/2015 |
| KR | 10-2015-0078272 | 7/2015 |

* cited by examiner

MASK ASSEMBLY, APPARATUS, AND METHOD OF MANUFACTURING DISPLAY DEVICE USING THE MASK ASSEMBLY

CROSS-REFERENCE TO RELATED APPLICATION

This application claims priority from and the benefit of Korean Patent Application No. 10-2015-0181848, filed on Dec. 18, 2015, which is hereby incorporated by reference for all purposes as if fully set forth herein.

BACKGROUND

Field

Exemplary embodiments relate to an apparatus and method. More particularly, exemplary embodiments relate to a mask assembly that may display high-resolution deposition patterns regardless of a size of a mask for deposition, and an apparatus and method of manufacturing a display device using the mask assembly.

Discussion of the Background

In general, among flat displays, an organic light-emitting display device is an active light-emissive display device and has wide viewing angles and excellent contrast. In addition, the organic light-emitting display device may be driven by a low voltage, and be light and thin while having a high response rate. Thus, organic light-emitting display devices have drawn attention as next-generation display devices.

An organic layer and/or an electrode of the organic light-emitting display device may be manufactured by a vacuum deposition method. However, as the resolution of the organic light-emitting display device increases, a mask that is used in the deposition process is required to be larger, and the width of open slits in the mask and distribution of the open slits are required to decrease.

However, as a size of a mask for deposition according to the related art increases, the mask is divided into a plurality of numbers and tension-welded to a separate frame. Thus, a process of manufacturing the mask is complicated, and the mask has to be periodically replaced in order to prevent deposition defects due to transformation of deposition patterns.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments include a mask assembly, and an apparatus and method of manufacturing a display device using the mask assembly.

Additional aspects will be set forth in part in the description which follows, and, in part, will be apparent from the disclosure, or may be learned by practice of the inventive concept.

According to an exemplary embodiment, a mask assembly includes a mask substrate configured to deposit a deposition material on a first pixel disposed on a device substrate comprising the first pixel and a second pixel, a molding layer stacked on the mask substrate and comprising a hole corresponding to a position of the second pixel disposed on the device substrate, and a blocking plate detachably mounted in the hole and configured to block the second pixel from the deposition material by covering the second pixel when the blocking plate is detached from the hole.

According to an exemplary embodiment, an apparatus for manufacturing a display device includes a mask assembly configured to deposit a deposition material on a first pixel disposed on a device substrate comprising the first pixel and a second pixel, a first magnetic member configured to ascend above the device substrate, and a second magnetic member configured to ascend below the mask assembly. The mask assembly includes a mask substrate, a molding layer stacked on the mask substrate, the molding layer including a hole corresponding to a position of the second pixel disposed on the device substrate, and a blocking plate detachably mounted in the hole and configured to block the second pixel from the deposition material by covering the second pixel when the blocking plate is detached from the hole. The first magnetic member is configured to pull the blocking plate from the hole to the second pixel, and the second magnetic member is configured to pull the blocking plate from the second pixel to the hole.

According to an exemplary embodiment, a method of manufacturing a display device includes providing a device substrate, providing a mask assembly, mounting the blocking plate on the pixel-defining layer surrounding the second pixel to block a deposition material from being deposited on the second pixel, depositing the deposition material on the exposed first electrode of the first pixel, and separating the blocking plate from the second pixel. The first pixel includes a first electrode, a second pixel, and a pixel-defining layer partially exposing first electrode of the first pixel. The mask assembly includes a mask substrate, a molding layer stacked on the mask substrate and comprising a hole corresponding to a position of the second pixel, and a blocking plate detachably mounted in the hole.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
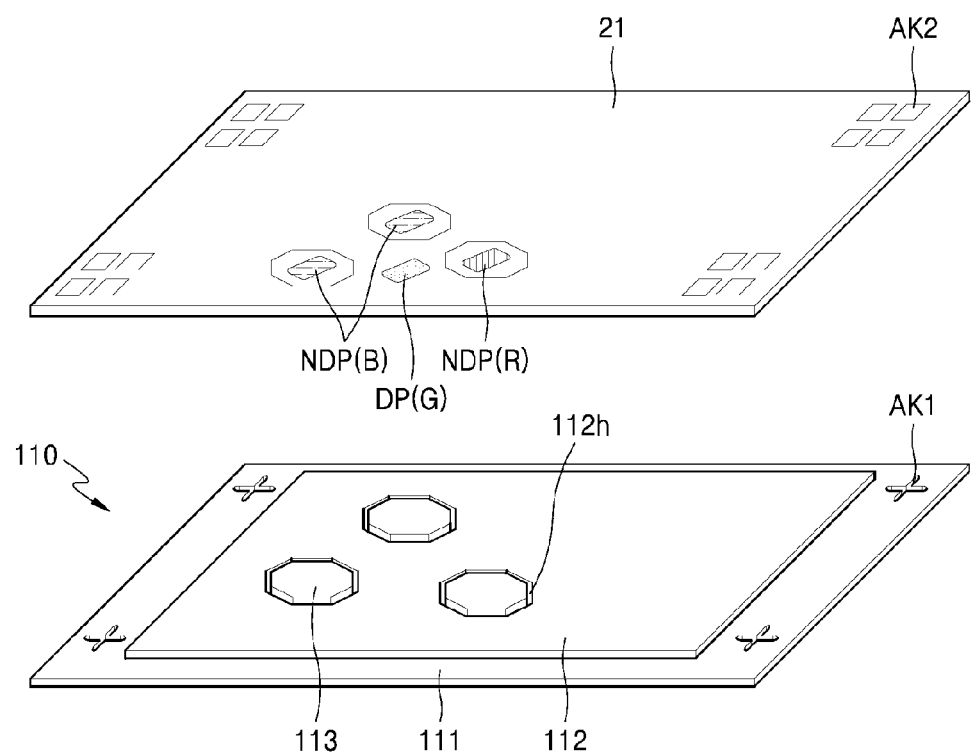
FIG. 1 is a schematic perspective view of a device substrate on which a mask assembly according to an exemplary embodiment and a deposition material are to be deposited.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
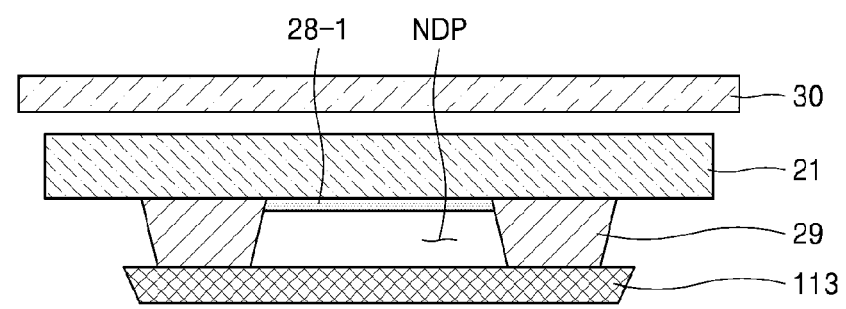
FIG. 2 is a partial cross-sectional view that schematically illustrates a blocking plate of FIG. 1 covering a second pixel of the device substrate.
Figure 2:
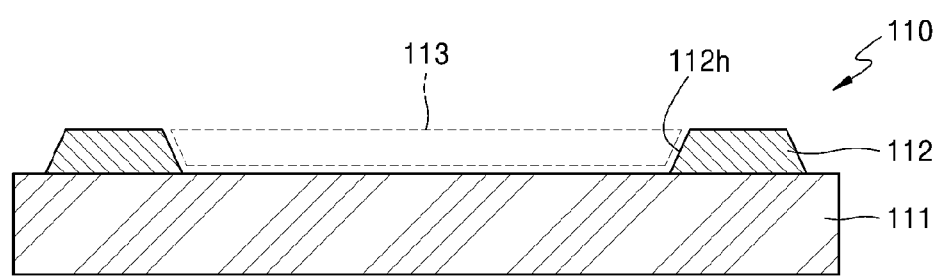

FIG. 1 is a schematic perspective view of a device substrate 21 on which a mask assembly 110 according to an exemplary embodiment and a deposition material are to be deposited. FIG. 2 is a partial cross-sectional view that schematically illustrates a blocking plate 113 of FIG. 1 covering a second pixel NDP of the device substrate 21.

Referring to FIGS. 1 and 2, the mask assembly 110 may include a mask substrate 111, a molding layer 112, and the blocking plate 113.

Figure 19:
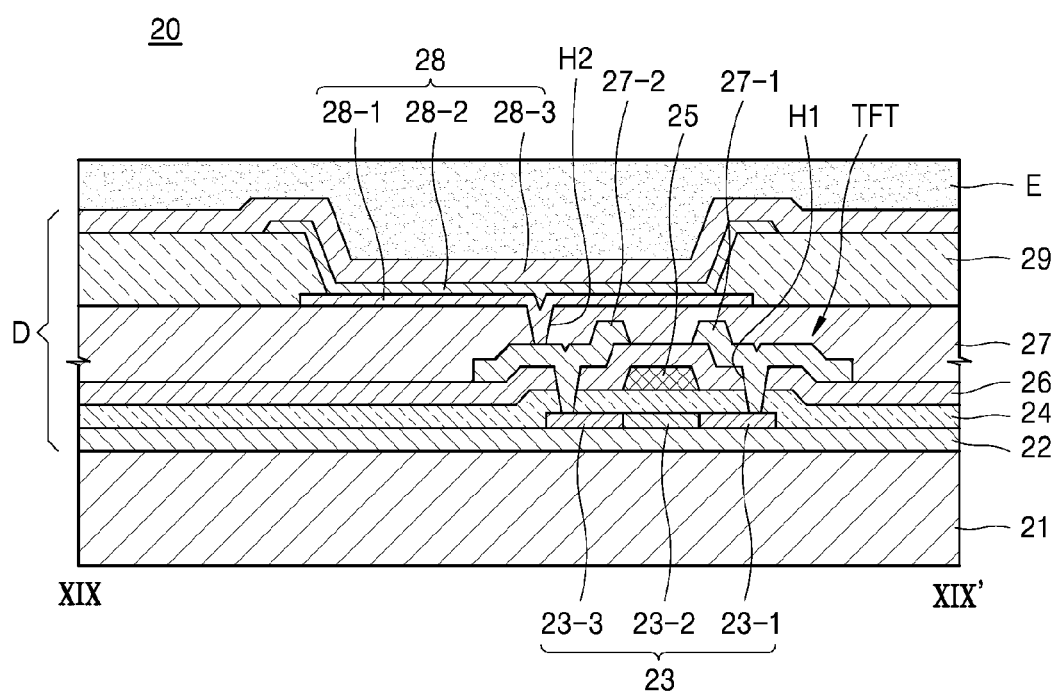
FIG. 19 is a cross-sectional view taken along line XIX-XIX' of FIG. 18.

The mask assembly 110 may be on the device substrate 21 and may be used to deposit a deposition material on a first pixel DP among pixels including the first pixel DP and the second pixel NDP. Regarding the device substrate 21 illustrated in FIG. 1, only some elements of a display device 20 that will be described later with reference to FIG. 19 are briefly illustrated for convenience in order to describe a structure of the mask assembly 110.

Each of the first pixel DP and the second pixel NDP does not refer to a certain pixel. That is, the first pixel DP refers to a pixel that is not covered by the blocking plate 113 to be described later and on which a deposition material is deposited in a deposition process, and the second pixel NDP refers to another pixel that is covered by the blocking plate 113 and on which no deposition material is deposited in the deposition process. Accordingly, one blocking plate 113 may cover the second pixel NDP in a deposition process and may cover a pixel that was the first pixel DP in a previous deposition process, in another deposition process that is consecutively performed afterwards. That is, a particular pixel may be the first pixel DP or the second pixel NDP in different deposition processes.

The mask substrate 111 may include a conductive material, and a first alignment key AK1 may be at an edge of the mask substrate 111. The first alignment key AK1 may penetrate the mask substrate 111, and although not illustrated, when the molding layer 112 is over the entire surface of the mask substrate 111, the first alignment key AK1 may penetrate the molding layer 112 or may penetrate both of the mask substrate 111 and the molding layer 112.

A formation position of the first alignment key AK1 is not limited to the edge of the mask substrate 111, and the first alignment key AK1 may be at any position on the mask assembly 110 that corresponds to a second alignment key AK2 that is at the device substrate 21. Instead of penetrating the mask substrate 111 or the molding layer 112, the first alignment key AK1 may include the same material as a pixel-defining layer 29 illustrated in FIG. 2 and may be on the mask substrate 111 or the molding layer 112.

The first alignment key AK1 and the second alignment key AK2 may be disposed on the mask substrate 111 and the device substrate 21, respectively, so as to overlap each other and may be arranged relative to each other before a deposition process and during the deposition process. Thus, the mask substrate 111 and the device substrate 21 may be arranged relative to each other. That is, due to the arrangement of the first alignment key AK1 and the second alignment key AK2, the blocking plate 113 to be described later may accurately cover the second pixel NDP.

The molding layer 112 may be stacked on the mask substrate 111 and may include a photoresist layer, such as an acrylic resin, polyimide (PI), or benzocyclobutene (BCB), a non-photosensitive organic material layer, or a non-photosensitive inorganic material layer. The molding layer 112 may include a hole 112h in a position that corresponds to the second pixel NDP of the device substrate 21.

The blocking plate 113 may be detachable from the hole 112h in the molding layer 112. As illustrated in FIG. 2, when the blocking plate 113 is detached from the hole 112h, the blocking plate 113 may cover the second pixel NDP and block a deposition material from being deposited on the second pixel NDP. The blocking plate 113 may include a conductive material and may be pulled by a first magnetic member 30 and a second magnetic member 40 that will be described later.

Figure 3:
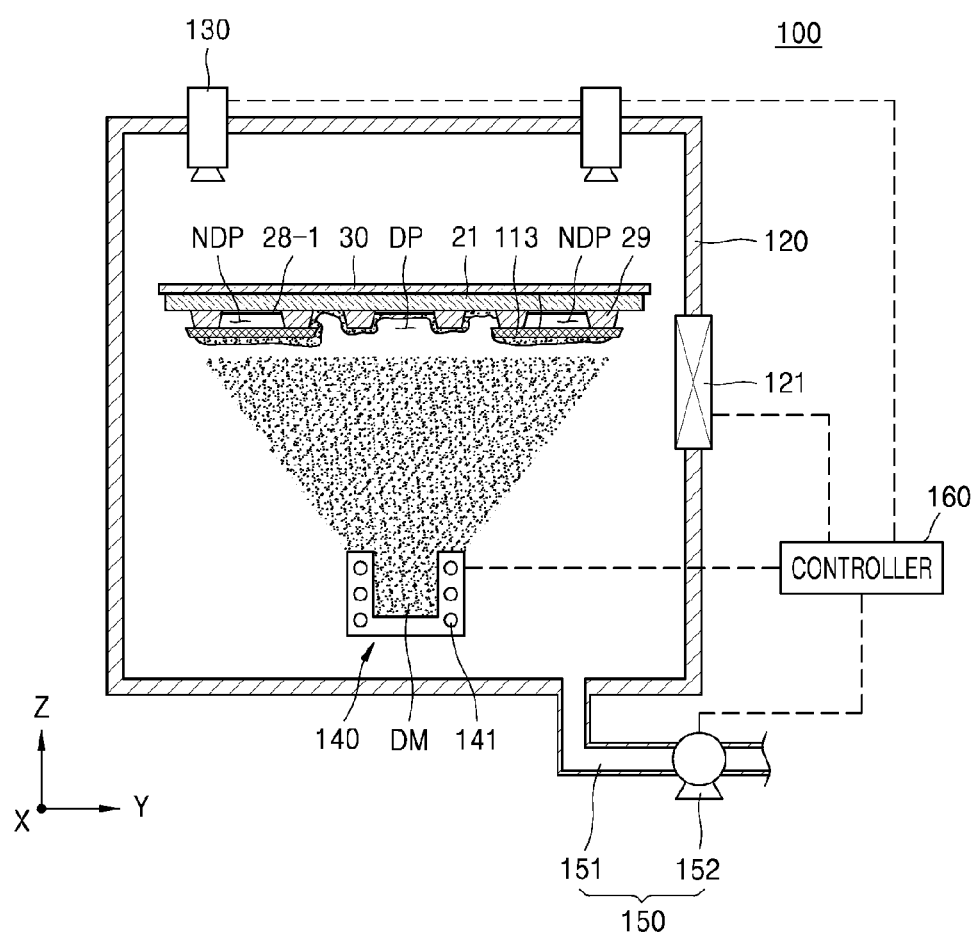
FIG. 3 is a schematic conceptual diagram of an apparatus for manufacturing a display device using the mask assembly of FIG. 1.
Figure 4:
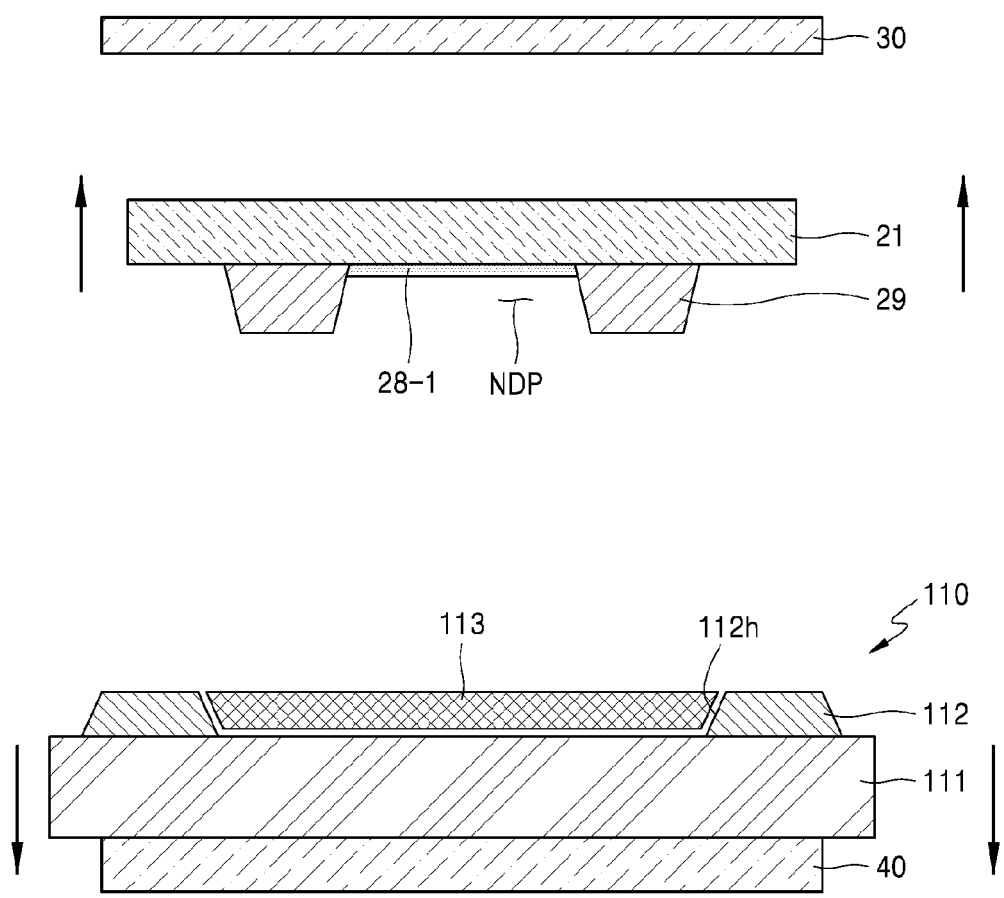
FIG. 4, FIG. 5, FIG. 6, and FIG. 7 are partial cross-sectional views that sequentially illustrate the blocking plate of FIG. 1 covering the second pixel.
Figure 8:
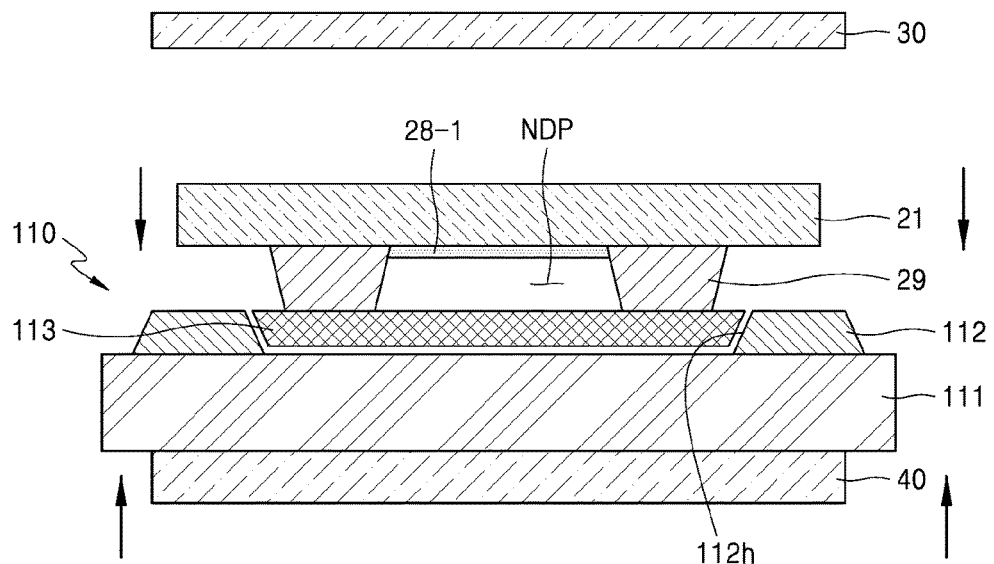
FIG. 8 and FIG. 9 are partial cross-sectional views that schematically illustrate the blocking plate of FIG. 1 being separated from the second pixel.
Figure 9:
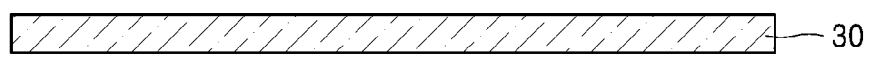
Figure 9:
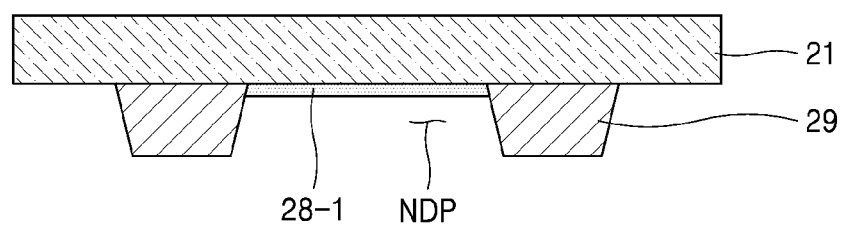
Figure 9:
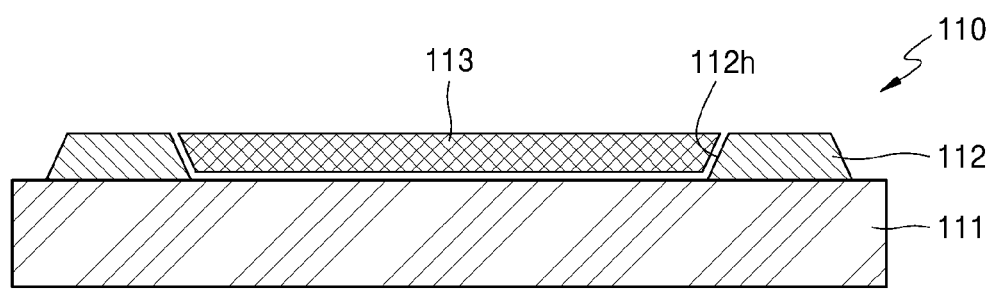

FIG. 3 is a schematic conceptual diagram of an apparatus 100 for manufacturing a display device using the mask assembly 110 of FIG. 1. FIG. 4, FIG. 5, FIG. 6, and FIG. 7 are partial cross-sectional views that sequentially illustrate the blocking plate 113 of FIG. 1 covering the second pixel NDP. FIG. 8 and FIG. 9 are partial cross-sectional views that schematically illustrate the blocking plate 113 of FIG. 1 being separated from the second pixel NDP.

Referring to FIG. 3, the apparatus 100 may include the mask assembly 110, a chamber 120, a vision unit 130, a deposition source 140, an adsorption unit 150, and a controller 160.

As described above, the mask assembly 110 may include the mask substrate 111, the molding layer 112, and the blocking plate 113. However, for clarity and by no means limiting, only the blocking plate 113 that is mounted on the pixel-defining layer 29 to cover the second pixel NDP in a deposition process is illustrated in FIG. 3. A method of mounting the blocking plate 113 on the pixel-defining layer 29 so as to cover the second pixel NDP will be described later with reference to FIG. 4, FIG. 5, FIG. 6, and FIG. 7.

The chamber 120 may include inner space for deposition and a gate valve 121 installed on the enclosure of the chamber 120. The controller 160 may control the gate valve 121 to open the internal space of the chamber 120 or close the internal space of the chamber 120. The gate valve may be any suitable mechanism for opening or closing the chamber such as a sealable door. The mask assembly 110 as described above may be carried into or out of the chamber 120 through the gate valve 121.

The vision unit 130 may include a camera. In this regard, the vision unit 130 may be controlled by the controller 160 and may capture positions of the device substrate 21 and the mask assembly 110 and provide necessary data to the controller 160 in the time of arrangement of the device substrate 21 and the mask assembly 110.

The deposition source 140 may face the device substrate 21, and a side of the deposition source 140 facing the device substrate 21 may be open. Also, the deposition source 140 may include a heater 141. The controller 160 may control the heater 141 to heat a deposition material DM.

The adsorption unit 150 may be connected to the chamber 120 and may be controlled by the controller 160 to maintain the pressure of the chamber 120 at a predetermined level. In this regard, the adsorption unit 150 may include a connection pipe 151 connected to the chamber 120 and a pump 152 mounted on the connection pipe 151.

Regarding an operation of the apparatus 100 as described above, the controller 160 may control the gate valve 121 to open, and thus, the chamber 120 may be open. In this regard, the adsorption unit 150 may be controlled by the controller 160 to adjust the inner pressure of the chamber 120 so as to be similar to atmospheric pressure.

When the gate valve 121 is controlled to be opened by the controller 160, the device substrate 21 and the mask assembly 110 may be carried into the chamber 120 from the outside of chamber 120. In this regard, the device substrate 21 and the mask assembly 110 may be carried by a robot arm or shuttle controlled by the controller 160.

After the device substrate 21 and the mask assembly 110 are carried into the chamber 120, the first alignment key AK1 and the second alignment key AK2 that may be respectively at the mask substrate 111 and the device substrate 21 may be arranged relative to each other to prepare for a deposition process. Also, a process of mounting the blocking plate 130 of the mask assembly 110 on the pixel-defining layer 29 so as to cover the second pixel NDP may be performed. In this regard, the first alignment key AK1 and the second alignment key AK2 may be arranged relative to each other not only before the deposition process begins but also while the deposition process is performed.

Hereinafter, a method of mounting the blocking plate 113 on the pixel-defining layer 29 surrounding the second pixel NDP so as to cover the second pixel NDP as illustrated in FIG. 3 will be described with reference to FIGS. 3, 4, 5, 6, and 7.

Referring to FIGS. 3, 4, 5, 6, and 7, the mask assembly 110 is disposed below the device substrate 21, and the first magnetic member 30 is disposed above the device substrate 21. That is, the blocking plate 113 of the mask assembly 110 may be carried into the chamber 120 while kept in the hole 112h between molding layers 112 on the mask substrate 111. A position of the blocking plate 113 may correspond to that of the second pixel NDP between pixel-defining layers 29 on a surface of the device substrate 21 (refer to FIG. 4).

Figure 5:
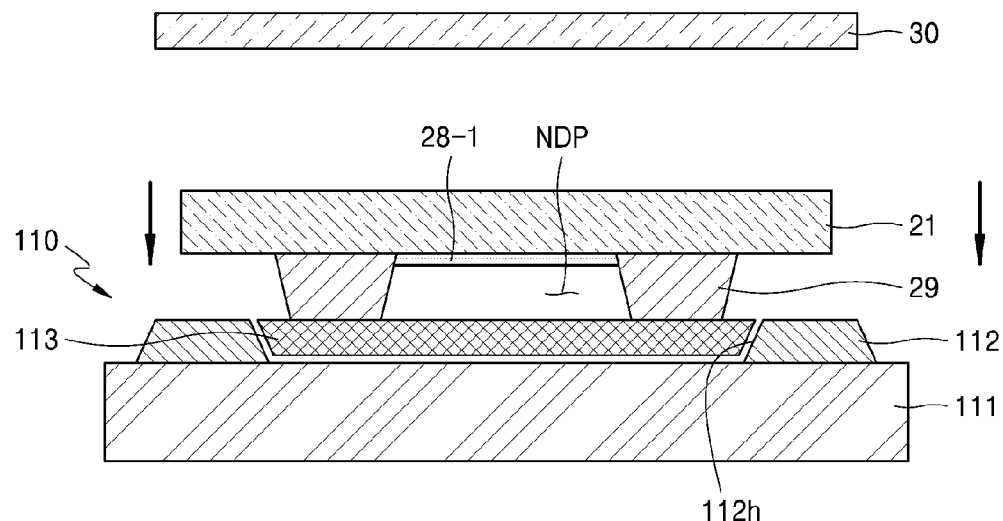

Next, the device substrate 21 may be moved toward the mask assembly 110 and descend until the pixel-defining layer 29 contacts the blocking plate 113 (refer to FIG. 5). In this regard, although not illustrated, the device substrate 21 may be connected to a separate driving means (not shown) that may elevate the device substrate 21 between the first magnetic member 30 and the mask assembly 110.

Figure 6:
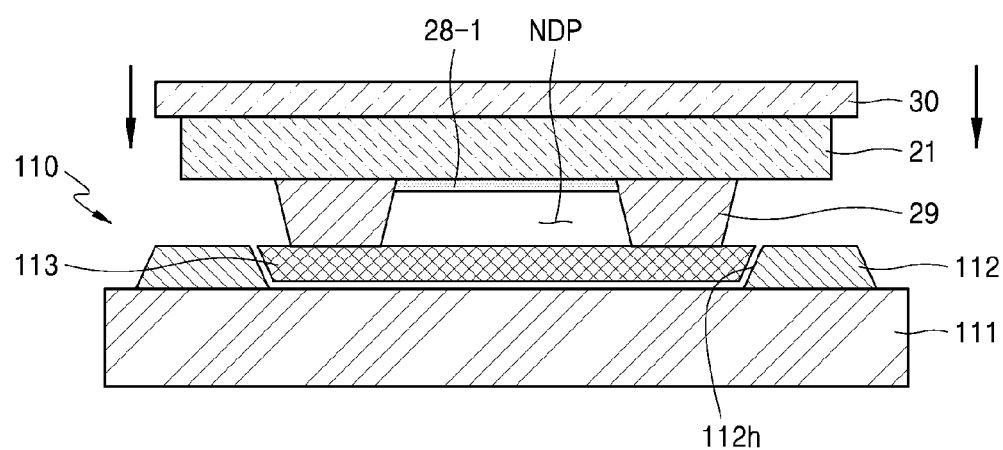

After the pixel-defining layer 29 on the surface of the device substrate 21 approaches the blocking plate 113, the first magnetic member 30 disposed above the device substrate 21 may approach the device substrate 21 (refer to FIG. 6). As the first magnetic member 30 approaches the device substrate 21 as such, the first magnetic member 30 may make the blocking plate 113 tightly adhere to the pixel-defining layer 29 by pulling the blocking plate 113 including a conductive material from the hole 112h to the second pixel NDP.

Next, the first magnetic member 30, the device substrate 21, and the blocking plate 113 tightly adhering to the pixel-defining layer 29 of the device substrate 21 may be separated from the mask substrate 111 and the molding layer 112 and ascend together. The mask substrate 111 and the molding layer 112 may be then carried out of the chamber 120 (refer to FIG. 7).

Afterwards, the chamber 120 may be closed, and as illustrated in FIG. 3, a deposition process may be performed while the blocking plate 113 adheres to the pixel-defining layer 29 due to a pulling force of the first magnetic member 30 which covers the second pixel NDP. That is, the blocking plate 113 may prevent the deposition material DM from the deposition source 140 from being deposited on the second pixel NDP in the deposition process.

Next, the blocking plate 113 may be separated from the second pixel NDP after the deposition process is completed. Referring to FIGS. 8 and 9, after the deposition process is completed, the mask substrate 111 and the molding layer 112 may be carried into the chamber 120 again. In this regard, the second magnetic member 40 for applying a pulling force to the blocking plate 113 may be disposed below the mask substrate 111 and the molding layer 112. After the deposition process is completed, the second magnetic field 40 may approach a lower side of the mask substrate 111 and provide the pulling force to the blocking plate 113. In this regard, the device substrate 21 may be separated from the first magnetic member 30 and descend towards the second magnetic member 40 (refer to FIG. 8).

Due to the descending of the device substrate 21, the blocking plate 113 may be seated in the hole 112h between the molding layers 112 on the mask substrate 111, and when the second magnetic member 40 approaches the lower side of the mask substrate 111, the blocking plate 113 may be pulled towards the second magnetic member 40. While the second magnetic member 40 approaches the lower side of the mask substrate 111 and seats the blocking plate 113 in the hole 112h as such, the mask substrate 111 and the second magnetic member 40 may descend, thereby separating the blocking plate 113 from the device substrate 21 (refer to FIG. 9).

As described above, when a deposition process is performed using the mask assembly 110 according to an exemplary embodiment and the apparatus 100 for manufacturing a display device including the mask assembly 110, even without using a separate shadow mask as in the related art, a deposition material may be deposited on the first pixel DP while the second pixel NDP is covered by the blocking plate 113.

A shadow mask of the related art has to be manufactured so as to correspond to a size of a device substrate on which a deposition material is to be deposited. Accordingly, as the device substrate gets bigger, a large shadow mask has been required, and as the shadow mask gets bigger, there has been a problem that the shadow mask sags towards a deposition source due to its weight.

In order to prevent the sagging, the shadow mask has been configured not as one shadow mask sheet that corresponds to one device substrate but as a division shadow mask that is divided into a plurality of numbers and tension-welded to a frame. However, such a shadow mask sheet or division shadow mask has a high unit cost, and when the shadow mask sheet or division shadow mask is used for a long time period, it has to be periodically replaced because deposition patterns are transformed.

However, when the deposition process is performed using the mask assembly 110 according to an exemplary embodiment, the mask assembly 110 may be manufactured by a simple process, a deposition process for manufacturing a high-resolution display device may be performed regardless of a size of a device substrate, and as long as the blocking plate 113 is periodically washed for long-term usage, cost may be dramatically saved.

Hereinafter, various modified examples of the blocking plate 113 will be described with reference to FIG. 10, FIG. 11, FIG. 12, FIG. 13, FIG. 14, FIG. 15, FIG. 16, and FIG. 17.

Figure 10:
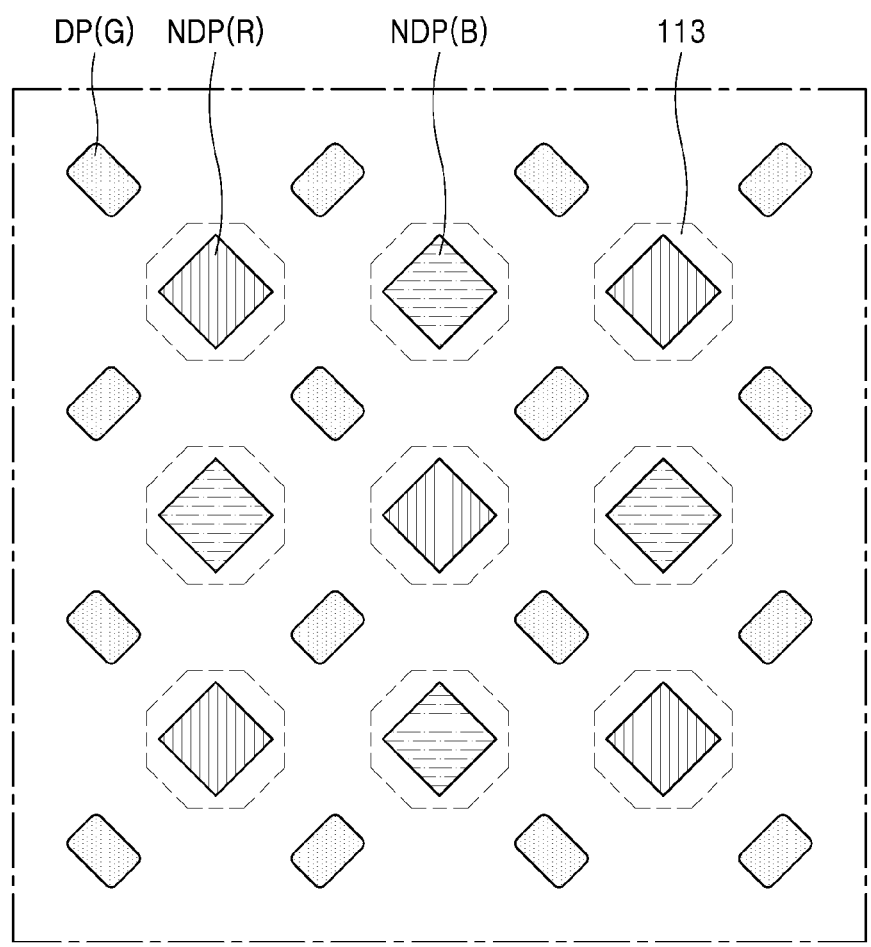
FIG. 10 is a perspective plan view that schematically illustrates the blocking plate of FIG. 1 covering each second pixel.
Figure 11:
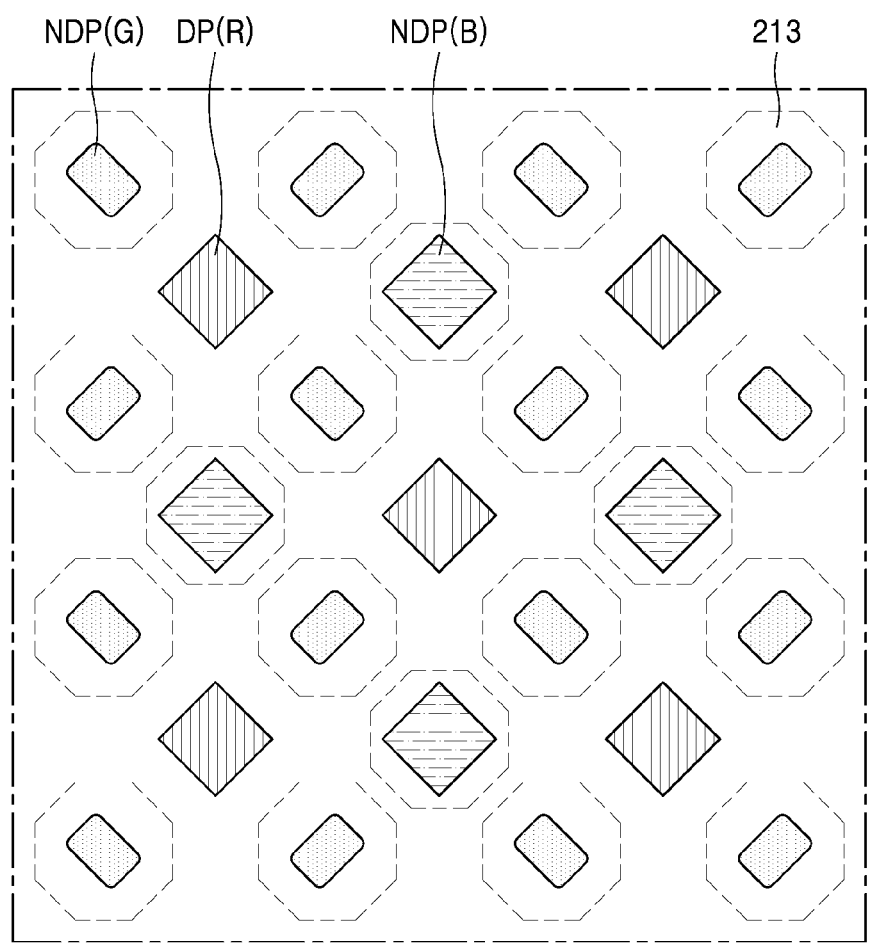
FIG. 11 is a plan view of a modified example of FIG. 10.
Figure 12:
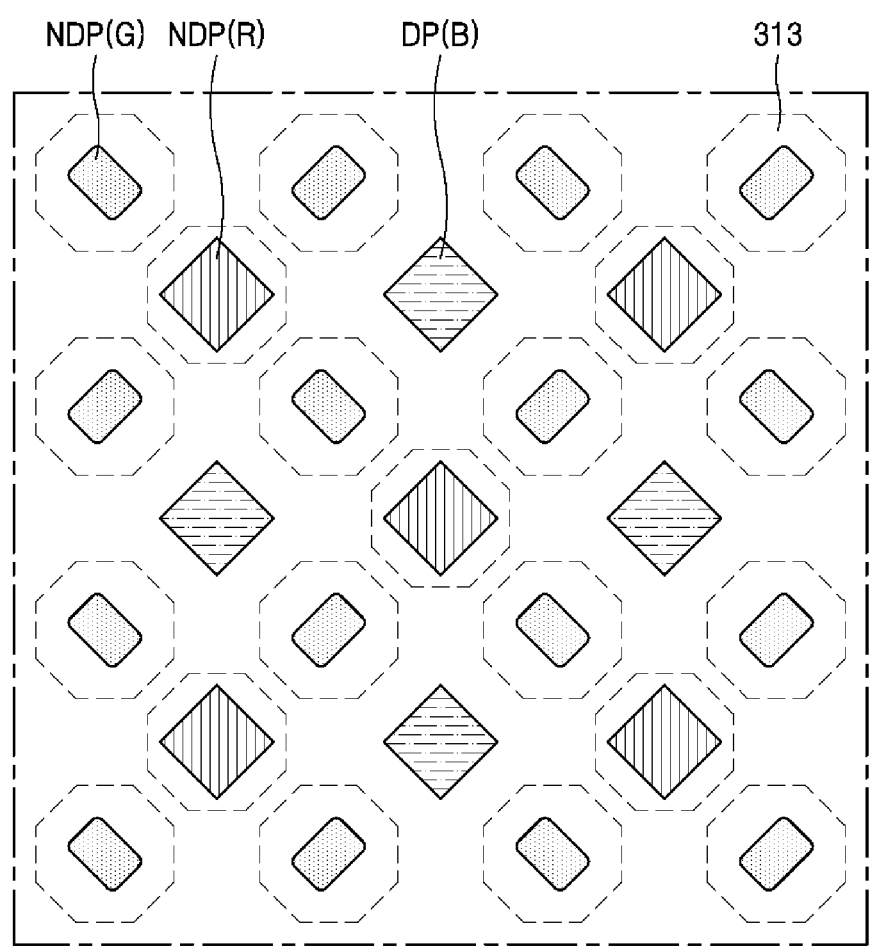
FIG. 12 is a plan view of another modified example of FIG. 10.
Figure 13:
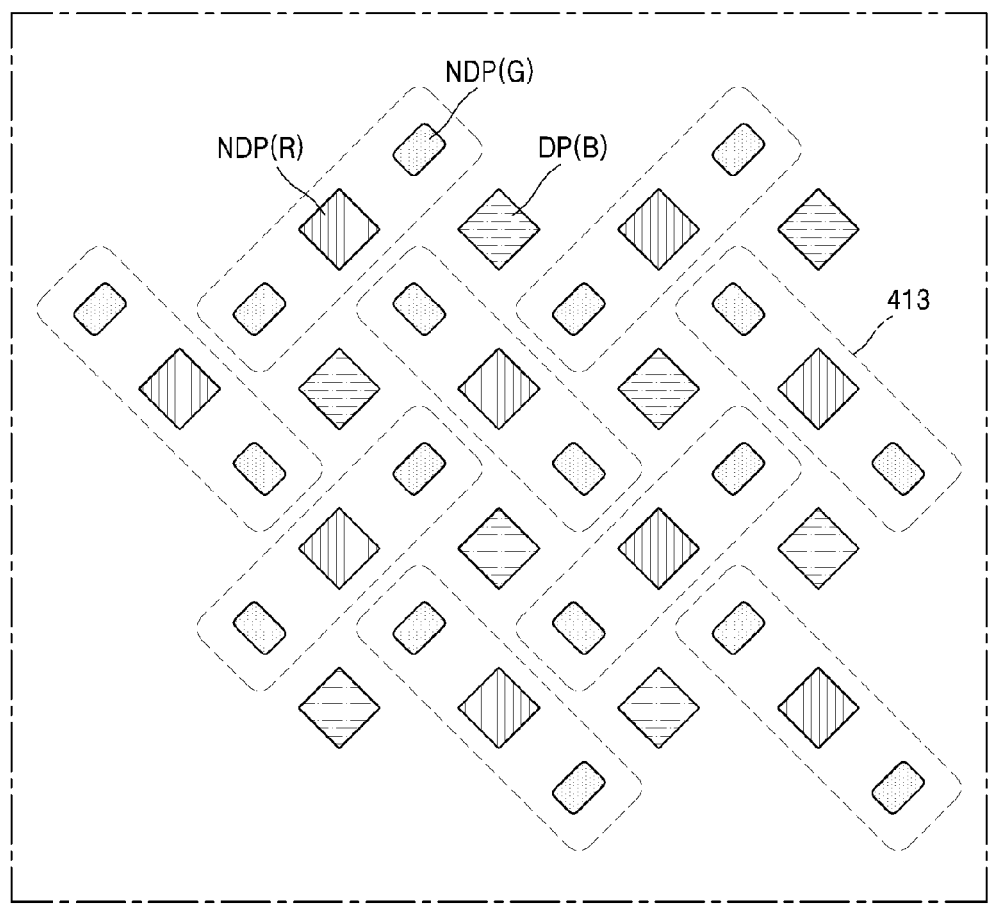
FIG. 13 is a plan view of another modified example of FIG. 10.
Figure 14:
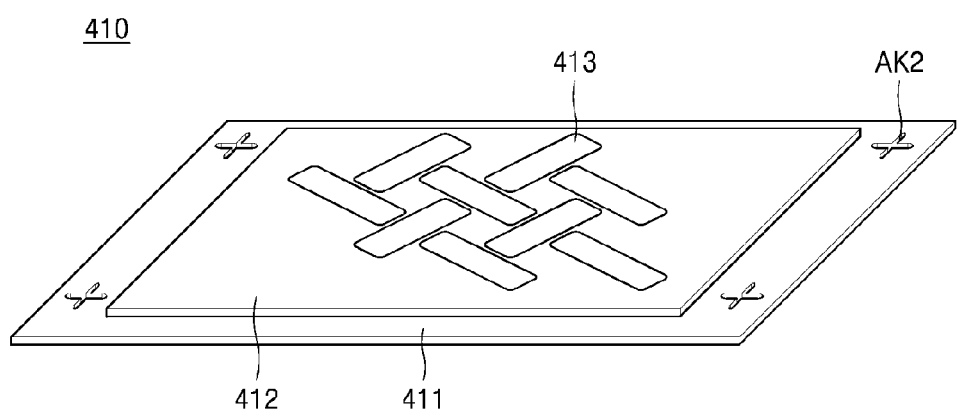
FIG. 14 is a schematic perspective view of a mask assembly including a blocking plate illustrated in FIG. 13.
Figure 15:
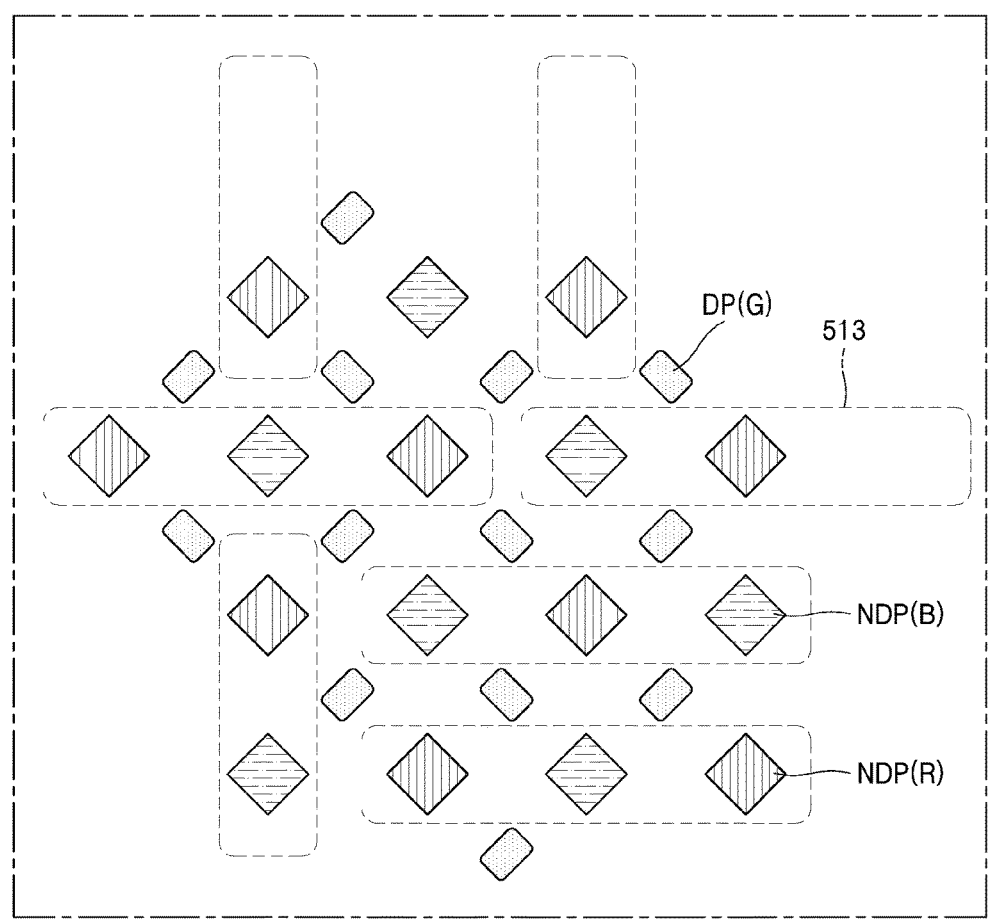
FIG. 15 is a plan view of a modified example of FIG. 13.
Figure 16:
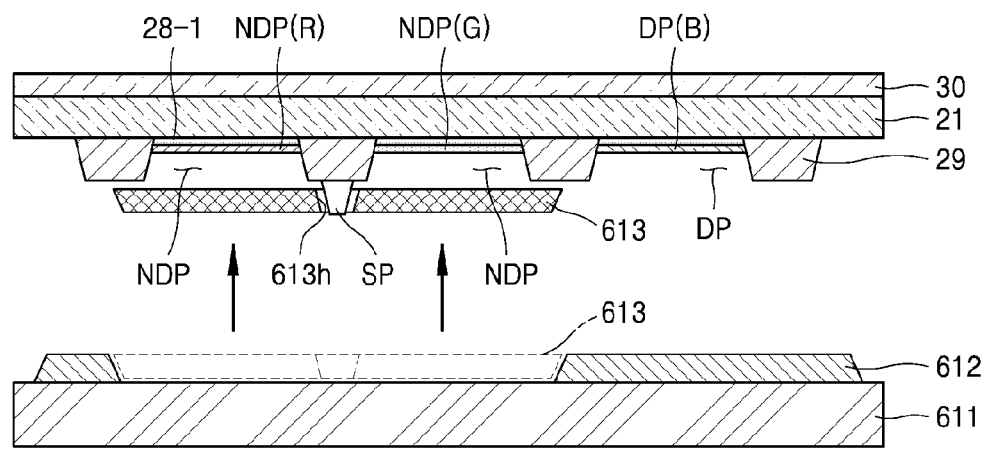
FIG. 16 is a plan view of a modified example of a blocking plate illustrated in FIG. 2.
Figure 17:
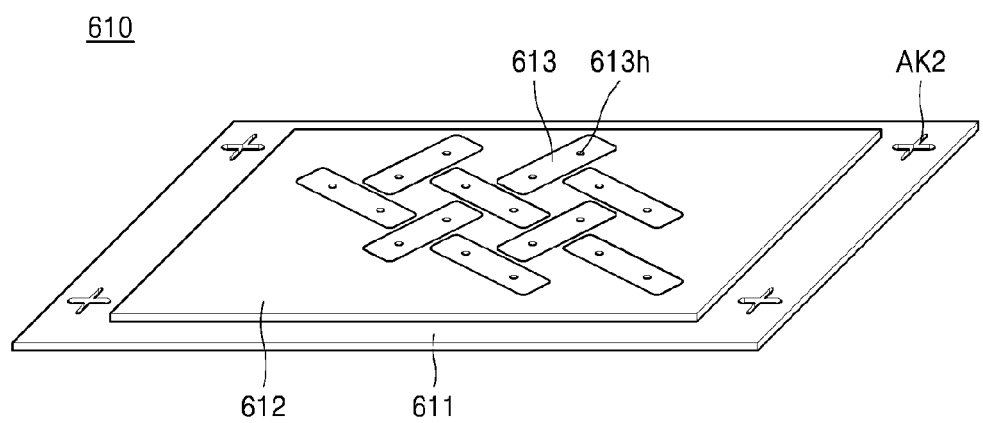
FIG. 17 is a schematic perspective view of a mask assembly including a blocking plate illustrated in FIG. 16.

FIG. 10 is a perspective plan view that schematically illustrates the blocking plate 113 of FIG. 1 covering each of second pixels NDP(R) and NDP(B). FIG. 11 is a plan view of a modified example of FIG. 10. FIG. 12 is a plan view of another modified example of FIG. 10. FIG. 13 is a plan view of another modified example of FIG. 10. FIG. 14 is a schematic perspective view of a mask assembly 410 including a blocking plate 413 illustrated in FIG. 13. FIG. 15 is a plan view of a modified example of FIG. 13. FIG. 16 is a plan view of a modified example of the blocking plate 113 illustrated in FIG. 2. FIG. 17 is a schematic perspective view of a mask assembly 810 including a blocking plate 813 illustrated in FIG. 16.

FIG. 10 illustrates the blocking plate 113 of FIG. 1 covering each of the second pixels NDP(R) and NDP(B). In this regard, the second pixel NDP(R) may be a pixel that emits red light, and the other second pixel NDP(B) may be a pixel that emits blue light. A first pixel DP(G) that is not covered by the blocking plate 113 may be a pixel that emits green light. Accordingly, the blocking plate 113 may cover each of the second pixels NDP(R) and NDP(B) respectively emitting red light and blue light and thus may leave the first pixel DP(G) open and cover each of the second pixels NDP(R) and NDP(B) so that a deposition material may be deposited only on the first pixel DP(G) emitting green light, that is on the device substrate 21.

In this regard, although it is illustrated in FIG. 10 for convenience that the deposition material is deposited on all of the first pixel DP(G) and the second pixels NDP(R) and NDP(B), exemplary embodiments are not limited thereto. For example, when the blocking plate 113 covers each of the second pixels NDP(R) and NDP(B) so that the deposition material may be deposited on the first pixel DP(G) first, the deposition material may not have been deposited on the second pixels NDP(R) and NDP(B). In addition, the deposition material may have been deposited on only one of two second pixels NDP(R) and NDP(B).

Referring to FIG. 11, a blocking plate 213 may cover each of second pixels NDP(G) and NDP(B). In this regard, the second pixel NDP(G) may be a pixel that emits green light, and the other second pixel NDP(B) may be a pixel that emits blue light. A first pixel DP(R) that is not covered by the blocking plate 213 may be a pixel that emits red light. Accordingly, the blocking plate 213 may cover each of the second pixels NDP(G) and NDP(B) respectively emitting green light and blue light and thus may leave the first pixel DP(R) open and cover each of the second pixels NDP(G) and NDP(B) so that the deposition material may be deposited only on the first pixel DP(R) emitting red light, that is on the device substrate 21.

In this regard, although it is illustrated in FIG. 11 for convenience of description that the deposition material is deposited on all of the first pixel DP(R) and the second pixels NDP(G) and NDP(B), exemplary embodiments are not limited thereto. For example, when the blocking plate 213 covers each of the second pixels NDP(G) and NDP(B) so that the deposition material may be deposited on the first pixel DP(R) first, the deposition material may not have been deposited on the second pixels NDP(G) and NDP(B). In addition, the deposition material may have been deposited on only one of two second pixels NDP(G) and NDP(B).

Referring to FIG. 12, a blocking plate 313 may cover each of second pixels NDP(R) and NDP(G). In this regard, the second pixel NDP(R) may be a pixel that emits red light, and the other second pixel NDP(G) may be a pixel that emits green light. A first pixel DP(B) that is not covered by the blocking plate 313 may be a pixel that emits blue light. Accordingly, the blocking plate 313 may cover each of the second pixels NDP(R) and NDP(G) respectively emitting red light and green light and thus may leave the first pixel DP(B) open and cover each of the second pixels NDP(R) and NDP(G) so that the deposition material may be deposited only on the first pixel DP(B) emitting blue light, that is on the device substrate 21.

In this regard, although it is illustrated in FIG. 12 for convenience of description that the deposition material is deposited on all of the first pixel DP(B) and the second pixels NDP(R) and NDP(G), exemplary embodiments are not limited thereto. For example, when the blocking plate 313 covers each of the second pixels NDP(R) and NDP(G) so that the deposition material may be deposited on the first pixel DP(B) first, the deposition material may not have been deposited on the second pixels NDP(R) and NDP(G). In addition, the deposition material may have been deposited on only one of two second pixels NDP(R) and NDP(G).

FIG. 13 illustrates the blocking plate 413 extending so as to cover a plurality of second pixels NDP(R) and NDP(G) that are adjacent to each other. The first pixel DP(B) may be exposed to the deposition material while in an open state that is not covered by the blocking plate 413.

FIG. 14 illustrates the blocking plate 413 of FIG. 13 included in the mask assembly 410. That is, although the blocking plate 413 may cover only one pixel as illustrated in FIG. 1, the disclosure is not limited thereto, and the blocking plate 413 may have a polygonal shape extending in a direction as illustrated in FIG. 14.

Referring to FIG. 15, a blocking plate 513 may cover a plurality of second pixels NDP(R) and NDP(B). That is, the blocking plate 513 may have a polygonal shape that covers two second pixels NDP(B) that emit blue light and one second pixel NDP(R) that emits red light or may have a stick shape that covers two second pixels NDP(R) that emit red light and one second pixel NDP(B) that emits blue light. The first pixel DP(G) that is not covered by the blocking plate 513 may be a device that emits green light.

In this regard, although it is illustrated in FIG. 15 for convenience of description that the deposition material is deposited on all of the first pixel DP(G) and the second pixels NDP(R) and NDP(B), exemplary embodiments are not limited thereto. For example, when the blocking plate 513 covers the second pixels NDP(R) and NDP(B) so that the deposition material may be deposited on the first pixel DP(G) first, the deposition material may not have been deposited on the second pixels NDP(R) and NDP(B). In addition, the deposition material may have been deposited on only one of two types of second pixels NDP(R) and NDP(G).

FIG. 16 and FIG. 17 illustrate the blocking plate 613 in which an accommodation hole 613h that accommodates a spacer SP is formed in a case where the spacer SP protrudes from the pixel-defining layer 29. In this regard, the spacer SP may protrude from the pixel-defining layer 29 disposed between pixels. Even in this case, the blocking plate 613 may be disposed above the pixel-defining layer 29 so as to cover a plurality of second pixels NDP(R) and NDP(G) as in the cases of the blocking plates 413 and 513 illustrated in FIG. 13, FIG. 14, and FIG. 15.

Figure 7:
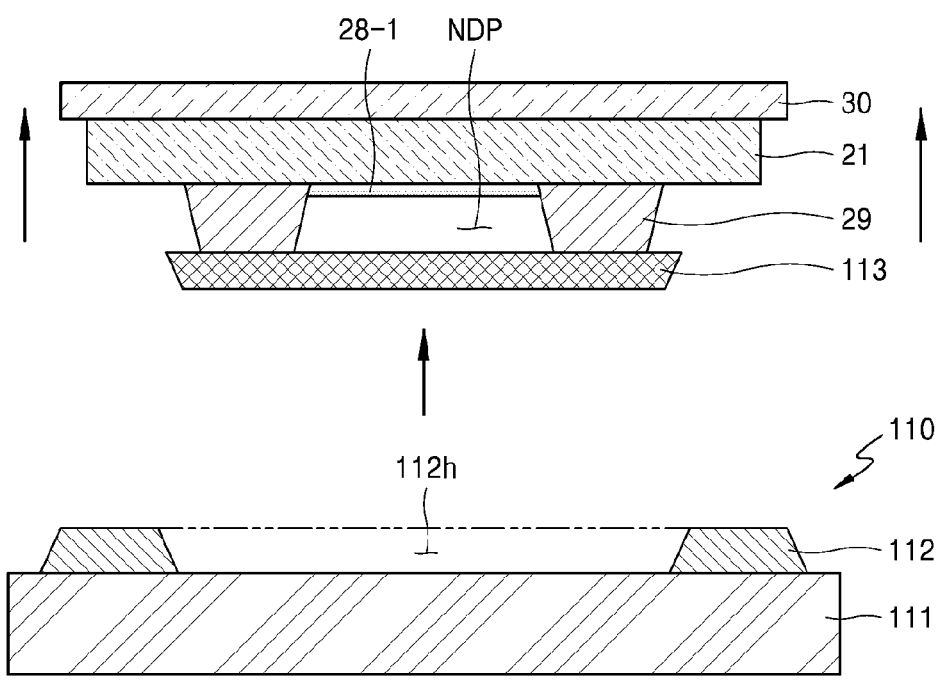
Figure 18:
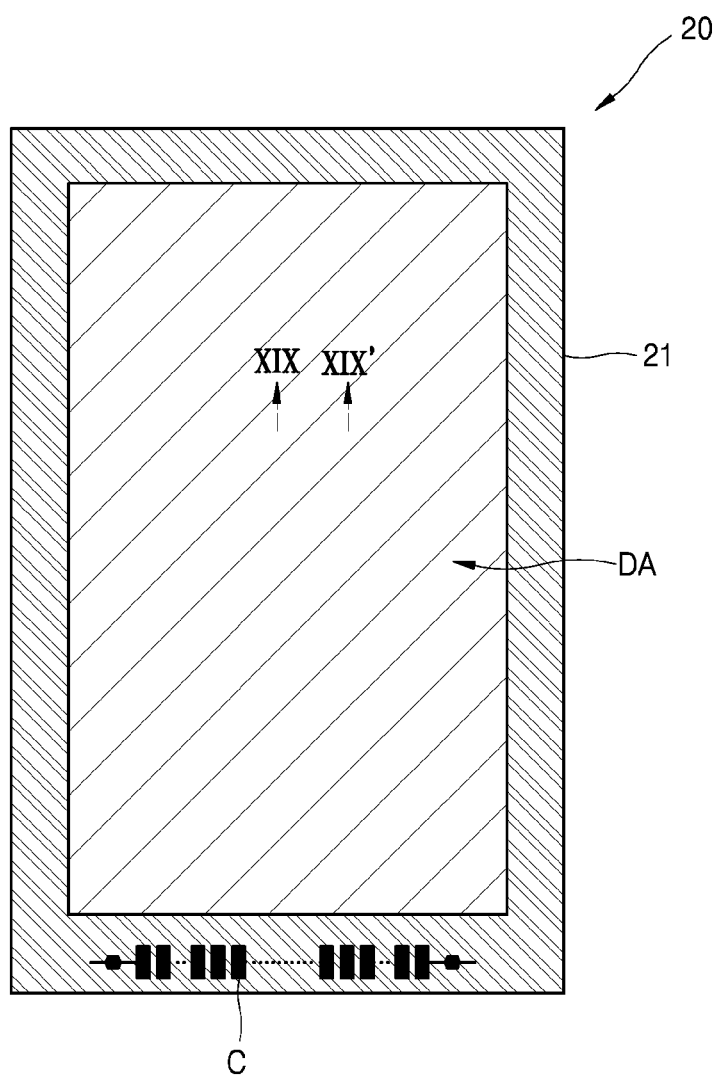
FIG. 18 is a plan view of a display device manufactured by using an apparatus for manufacturing a display device, illustrated in FIG. 7.

FIG. 18 is a plan view of the display device 20 manufactured by using the apparatus 100 for manufacturing a display device, illustrated in FIG. 7. FIG. 19 is a cross-sectional view taken along line XIX-XIX' of FIG. 18.

Referring to FIG. 18 and FIG. 19, in the display device 20, a display area DA and a non-display area outside the display area DA may be defined on the device substrate 21. An emission unit D may be arranged in the display area DA, and a power wiring (not shown) may be arranged in the non-display area. Also, a pad unit C may be arranged in the non-display area.

The display device 20 may include the device substrate 21 and the emission unit D. Also, the display device 20 may include a thin film encapsulation layer E formed above the emission unit D. In this regard, the device substrate 21 may include a plastic material. Alternatively, the device substrate 21 may include a metal material, such as stainless steel (SUS) and titanium (Ti). Alternatively, the device substrate 21 may include PI. Hereinafter, for convenience of description, the case where the device substrate 21 includes PI will be mainly described.

The emission unit D may be formed on the device substrate 21. In this regard, the emission unit D may include a thin film transistor TFT, and a passivation layer 27 may be formed so as to cover the thin film transistor TFT. An organic light-emitting device (OLED) 28 may be formed on the passivation layer 27.

In this regard, the device substrate 21 may include a glass material. However, it is not limited thereto. The device substrate 21 may include a plastic material, or a metal material, such as SUS and Ti. Alternatively, the device substrate 21 may include PI. Hereinafter, for convenience of description, the case where the device substrate 21 includes a glass material will be mainly described.

A buffer layer 22 including an organic compound and/or an inorganic compound may be further formed on the device substrate 21. The buffer layer 22 may include silicon oxide ($SiO_X$, where x≥1) or silicon nitride $SiN_Y$ where Y≥1).

After an active layer 23 is formed on the buffer layer 22 in a certain pattern, the active layer 23 may be covered by a gate insulating layer 24. The active layer 23 may include a source area 23-1, a drain area 23-3, and a channel area 23-2 between the source area 23-1 and the drain area 23-3.

The active layer 23 may include various materials. For example, the active layer 23 may include at least one of an inorganic semiconductor material an oxide semiconductor material, and an organic semiconductor material. For example, the active layer 23 may include an inorganic semiconductor material such as amorphous silicon or crystalline silicon. For convenience of description and by no means limiting, the case where the active layer 23 includes amorphous silicon will be mainly described.

After an amorphous silicon layer is formed on the buffer layer 22, the amorphous silicon layer is crystallized to form a polycrystalline silicon layer, and then, the polycrystalline silicon layer may be patterned to form the active layer 23. The source area 23-1 and the drain area 23-3 of the active layer 23 may be doped with impurities according to the type of a thin film transistor, such as a driving thin film transistor (not shown) or a switching thin film transistor (not shown).

A gate electrode 25 corresponding to the active layer 23 and an interlayer insulating layer 26 covering the gate electrode 25 may be formed on the gate insulating layer 24.

After a contact hole H1 is formed in the interlayer insulating layer 26 and the gate insulating layer 24, a source electrode 27-1 and a drain electrode 27-2 may be formed on the interlayer insulating layer 26 to contact the source area 23-1 and the drain area 23-3, respectively.

The passivation layer 27 may be formed on the thin film transistor TFT, and a pixel electrode 28-1 of the OLED 28 may be formed on the passivation layer 27. The pixel electrode 28-1 contacts the drain electrode 27-2 of the thin film transistor TFT via a hole H2 in the passivation layer 27.

The passivation layer 27 may include a single layer or layers including an inorganic material and/or an organic material. The passivation layer 27 may include a planarization layer to planarize a layer below the passivation layer 27, no matter how curved the layer below the passivation layer 27 is. Also, the passivation layer 27 may be formed so as to be curved in correspondence to a curved layer below the passivation layer 27. The passivation layer 27 may include a transparent insulator in order to achieve a resonance effect.

After the pixel electrode 28-1 is formed on the passivation layer 27, the pixel-defining layer 29, including at least one of an organic material and an inorganic material, may be formed so as to cover the pixel electrode 28-1 and the passivation layer 27, and an opening is formed in the pixel-defining layer 29 so as to expose the pixel electrode 28-1.

Then, an intermediate layer 28-2 and an opposite electrode 28-3 may be formed at least on the pixel electrode 28-1.

The pixel electrode 28-1 may serve as an anode, and the opposite electrode 28-3 may serve as a cathode. However, the polarities of the pixel electrode 28-1 and the opposite electrode 28-3 may be the opposite.

The pixel electrode 28-1 and the opposite electrode 28-3 may be insulated from each other by the intermediate layer 28-2, and voltages of different polarities may be applied to the intermediate layer 28-2 so that light is emitted from an organic emission layer.

The intermediate layer 28-2 may include the organic emission layer. According to an exemplary embodiment, the intermediate layer 28-2 may include the organic emission layer, and may further include at least one of a hole injection layer (HIL), a hole transport layer (HTL), an electron transport layer (ETL), and an electron injection layer (EIL). Exemplary embodiments are not limited thereto, and the intermediate layer 28-2 may include the organic emission layer and may further include various other function layers (not shown).

In this regard, the intermediate layer 28-2 may be formed by using an apparatus (not shown) for manufacturing a display device as described above.

A unit pixel includes a plurality of sub-pixels, which may emit various colors of light. For example, the plurality of sub-pixels may include sub-pixels which emit red, green, and blue colors of light, respectively, and sub-pixels (not shown) which may emit red, green, blue, and white colors of light, respectively.

The thin film encapsulation layer E may include a plurality of inorganic layers or may include an inorganic layer and an organic layer.

The organic layer of the thin film encapsulation layer E may include a polymer and may include a single layer or stacked layers including any one of polyethylene terephthalate, PI, polycarbonate, epoxy, polyethylene, and polyacrylate. The organic layer may include polyacrylate. In detail, the organic layer may include a polymerized monomer composition including a diacrylate-based monomer and a triacrylate-based monomer. The monomer composition may further include a monoacrylate-based monomer. Although the monomer composition may further include a general photoinitiator, such as diphenyl (2,4,6-trimethylbenzoyl) phosphine oxide (TPO), it is not limited thereto.

The inorganic layer of the thin film encapsulation layer E may include a single layer or stacked layers including a metal oxide or a metal nitride. In detail, the inorganic layer may include any one of silicon nitride ($SiN_Y$ where Y≥1), aluminum oxide ($Al_2O_3$, $SiO_2$), and titanium dioxide ($TiO_2$).

An uppermost layer of the thin film encapsulation layer E, which is exposed to the outside, may include an inorganic layer which may prevent water penetration into the OLED 28.

The thin film encapsulation layer E may include at least one structure in which at least one organic layer is inserted between at least two inorganic layers. As another example, the thin film encapsulation layer E may include at least one structure in which at least one inorganic layer is inserted between at least two organic layers. As another example, the thin film encapsulation layer E may include a structure in which at least one organic layer is inserted between at least two inorganic layers and a structure in which at least one inorganic layer is inserted between at least two organic layers.

The thin film encapsulation layer E may sequentially include a first inorganic layer, a first organic layer, and a second inorganic layer on the OLED 28 in this order.

As another example, the thin film encapsulation layer E may sequentially include a first inorganic layer, a first organic layer, a second inorganic layer, a second organic layer, and a third inorganic layer on the OLED 28 in this order.

As another example, the thin film encapsulation layer E may sequentially include a first inorganic layer, a first organic layer, a second inorganic layer, a second organic layer, a third inorganic layer, a third organic layer, and a fourth inorganic layer on the OLED 28 in this order.

A halogenated metal layer including lithium fluoride (LiF) may further be included between the OLED 28 and the first inorganic layer. The halogenated metal layer may prevent damage to the OLED 28 when the first inorganic layer is formed by sputtering.

An area of the first organic layer may be smaller than an area of the second inorganic layer, and an area of the second organic layer may be smaller than an area of the third inorganic layer.

Accordingly, the display device 20 includes the intermediate layer 28-2 forming detailed patterns, and as the intermediate layer 28-2 is deposited in an accurate position, the display device 20 may display a detailed image. Also, although repeatedly deposited, the intermediate layer 28-2 may form consistent patterns, and thus, the display device 20 displays uniform quality as it is continuously manufactured.

The controller 160 and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like. In this manner, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. As such, the controller 160 and/or one or more components thereof may include or otherwise be associated with one or more memories (not shown) including code (e.g., instructions) configured to cause the controller 160 and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile s media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CDRW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

According to one or more of the above exemplary embodiments, a mask assembly is provided that may control deposition of a deposition material with respect to each pixel regardless of a size of a mask, and an apparatus and method of manufacturing a display device using the mask assembly.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An apparatus for manufacturing a display device, the apparatus comprising:
   a mask assembly configured to deposit a deposition material on a first pixel disposed on a device substrate comprising the first pixel and a second pixel;
   a first magnetic member configured to ascend above the device substrate; and
   a second magnetic member configured to ascend below the mask assembly,
   wherein the mask assembly comprises:
      a mask substrate,
      a molding layer stacked on the mask substrate, the molding layer comprising a hole corresponding to a position of the second pixel disposed on the device substrate, and
      a blocking plate detachably mounted in the hole and configured to block the second pixel from the deposition material by covering the second pixel when the blocking plate is detached from the hole,
   the first magnetic member is configured to pull the blocking plate from the hole to the second pixel, and
   the second magnetic member is configured to pull the blocking plate from the second pixel to the hole.

2. The apparatus of claim 1, wherein the mask substrate comprises a conductive material.

3. The apparatus of claim 1, wherein the molding layer comprises at least one of acrylic resin, polyimide (PI), benzocyclobutene (BCB), a non-photosensitive organic material layer, and a non-photosensitive inorganic material layer.

4. The apparatus of claim 1, wherein the hole extends to correspond to positions of a plurality of second pixels that are adjacent to each other and disposed on the device substrate, and
   the blocking plate extends to cover the plurality of second pixels that are adjacent to each other when the blocking plate is detached from the hole.

5. The apparatus of claim 1, wherein the blocking plate comprises a conductive material.

6. The apparatus of claim 1, wherein the device substrate further comprises a first electrode, a pixel-defining layer partially exposing the first electrode, and a spacer protruding from the pixel-defining layer, and
   the blocking plate comprises an accommodation hole that accommodates the spacer.

7. The apparatus of claim 1, wherein the device substrate comprises a first alignment key, and
   at least one of the mask substrate and the molding layer comprises a second alignment key corresponding to the first alignment key.

* * * * *